United States Patent
Luo et al.

(10) Patent No.: US 9,837,971 B2
(45) Date of Patent: Dec. 5, 2017

(54) METHOD AND SYSTEM FOR EXCURSION PROTECTION OF A SPEAKER

(75) Inventors: Chenchi Luo, Atlanta, GA (US); Milind A. Borkar, Dallas, TX (US); Arthur J. Redfern, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 951 days.

(21) Appl. No.: 13/447,396

(22) Filed: Apr. 16, 2012

(65) Prior Publication Data

US 2012/0281844 A1  Nov. 8, 2012

Related U.S. Application Data

(60) Provisional application No. 61/482,327, filed on May 4, 2011.

(51) Int. Cl.
H03G 11/00 (2006.01)
H03F 1/52 (2006.01)
H03F 3/181 (2006.01)
H04R 3/00 (2006.01)

(52) U.S. Cl.
CPC ............. *H03F 1/52* (2013.01); *H03F 3/181* (2013.01); *H04R 3/002* (2013.01); *H04R 3/007* (2013.01)

(58) Field of Classification Search
CPC ......... H03F 1/52; H03F 3/181; H04R 29/001; H04R 3/007; H04R 3/002; H04R 3/00; H04R 3/02
USPC ......... 381/55–59, 96, 98, 103, 106, 111, 117
See application file for complete search history.

(56) References Cited

U.S. PATENT DOCUMENTS

| | | | | |
|---|---|---|---|---|
| 7,274,793 | B2 * | 9/2007 | Combest | H04R 3/002 381/55 |
| 8,019,088 | B2 * | 9/2011 | Holman | 381/55 |
| 8,577,047 | B2 * | 11/2013 | Gautama | 381/55 |
| 2005/0031139 | A1 * | 2/2005 | Browning et al. | 381/96 |
| 2010/0254546 | A1 * | 10/2010 | Hosomi | 381/106 |
| 2011/0228945 | A1 * | 9/2011 | Mihelich | H04R 3/002 381/59 |

OTHER PUBLICATIONS

"Tutorial: Loudspeaker Nonlinearities-Causes, Parameters, Symptoms"; Wolfgang Klippel, J. Audio Eng. Soc., vol. 54, No. 10, Oct. 2006, pp. 907-939.
"Audio Output Enhancement Algorithms for Piezoelectric Loudspeakers", Leung Kin Chiu et al., 2011 IEEE, pp. 317-320.
"Active Control of Loudspeakers: An Investigation of Practical Applications", Andrew Bright, Orsted DTU, Acoustic Technology, Technical University of Denmark, Building 352, DK-2800 Kgs. Lyngby, Denmark, 2002, pp. 1-203.

(Continued)

*Primary Examiner* — Lun-See Lao
(74) *Attorney, Agent, or Firm* — Gregory J. Albin; Charles A. Brill; Frank D. Cimino

(57) ABSTRACT

For protecting a speaker, an input signal is received, and an excursion of the speaker that would be caused by the input signal is predicted. In response to the predicted excursion exceeding a threshold, a targeted excursion of the speaker is determined by compressing the predicted excursion. The targeted excursion is translated into an output signal, which is output to the speaker.

27 Claims, 5 Drawing Sheets

(56) References Cited

OTHER PUBLICATIONS

"Dynamic Measurement and Interpretation of the Nonlinear Parameters of Electrodynamic Loudspeakers" Wolfgang Klippel, J. Audio Eng. Soc., vol. 38, No. 12, Dec. 1990, pp. 944-955.

"The Mirror Filter—A New Basis for Linear Equalization and Nonlinear Distortion Reduction of Woofer Systems", Wolfgang Kippel, Institute of Technical Acoustics, Technical University Dresden, Germany, Audio Engineering Society, Mar. 24-27, 1992, pp. 1-20, Figs. 1-27.

"Tracking Changes in Linear Loudspeaker Parameters with Current Feedback", Andrew Bright, Nokia Corporation, FIN-00045, Nokia Group, Helsinki, Finland, Audio Engineering Society, 115th Convention, Oct. 10-13, 2003, pp. 1-11.

* cited by examiner

METHOD AND SYSTEM FOR EXCURSION PROTECTION OF A SPEAKER

CROSS-REFERENCE TO RELATED APPLICATION

This application claims priority to U.S. Provisional Patent Application Ser. No. 61/482,327, filed May 4, 2011, entitled SYSTEM AND METHOD FOR LOUDSPEAKER EXCURSION PROTECTION, naming Chenchi Luo et al as inventors, which is hereby fully incorporated herein by reference for all purposes.

BACKGROUND

The disclosures herein relate in general to digital signal processing, and in particular to a method and system for excursion protection of a speaker.

Many portable electronic devices are relatively small and inexpensive. Accordingly: (a) such devices may have speakers that are relatively small and inexpensive; and (b) drive units of the speakers may have relatively low power handling capacity and relatively low sensitivity, which increases risk that a powerful amplifier might push them to power handling and mechanical limits in an attempt to reach higher sound volumes. Causes of speaker failure include: (a) over-excursion (e.g., excessive backward and/or forward movement) of the speaker's diaphragm; and (b) overheating of the speaker's voice coil. For example, if the speaker receives an input voltage signal whose level is relatively high and whose frequency is relatively low, then the speaker's voice coil may exit its safe gap and thereby damage the speaker. In some cases, a sensor can directly monitor excursion of the speaker's diaphragm, but the sensor's size and expense may be impractical for many portable electronic devices.

In a conventional dynamic range compression ("DRC") technique, the input voltage signal is received by a dynamic range compressor. In one example: (a) if the input voltage signal's amplitude exceeds a threshold's limit, then the signal is dynamically compressed by the dynamic range compressor; and (b) otherwise, the signal is unmodified by the dynamic range compressor. However, the input voltage signal's amplitude is nonlinearly related to excursion of the speaker's diaphragm, so that: (a) DRC may unnecessarily compress the signal (in a manner that distorts sound and/or reduces perceived loudness of the speaker), despite peak excursion of the speaker already being within a safe operating range; and/or (b) over-excursion of the speaker may still occur, despite the input voltage signal's amplitude being within the threshold's limit. Accordingly, a different technique would be useful for keeping such excursion within a safe operating range, in order to protect the speaker.

SUMMARY

For protecting a speaker, an input signal is received, and an excursion of the speaker that would be caused by the input signal is predicted. In response to the predicted excursion exceeding a threshold, a targeted excursion of the speaker is determined by compressing the predicted excursion. The targeted excursion is translated into an output signal, which is output to the speaker.

DETAILED DESCRIPTION

Figure 1:
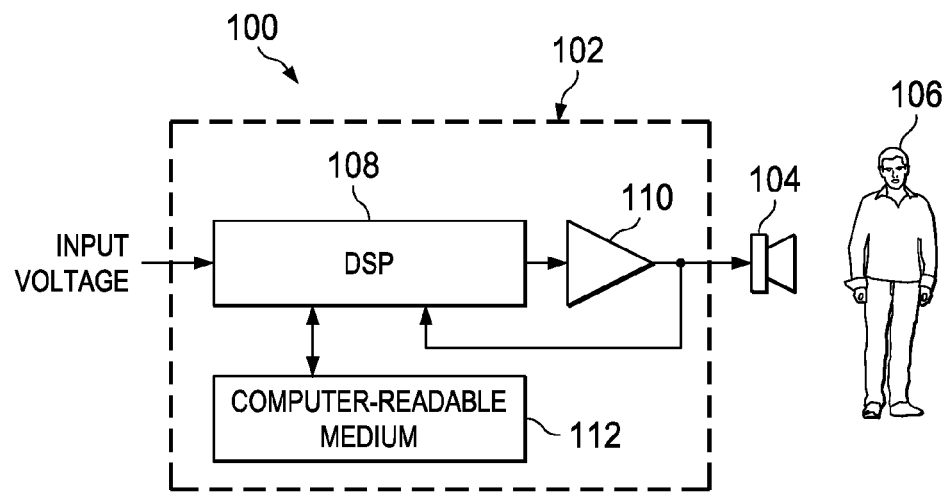
FIG. 1 is a block diagram of an information handling system of the illustrative embodiments.

FIG. 1 is a block diagram of an information handling system, indicated generally at 100, of the illustrative embodiments. In response to electrical signals from a control device 102, a speaker 104 outputs audio signals, so that a human user 106 is thereby enabled to hear such audio signals. In the example of FIG. 1: (a) the speaker 104 is a micro-loudspeaker; and (b) the control device 102 and the speaker 104 are components of a portable handheld electronics device (not shown in FIG. 1), such as a mobile smartphone, whose various components are housed integrally with one another.

The control device 102 includes various electronic circuitry components for performing the control device 102 operations, such as: (a) a multimedia interface digital signal processor ("DSP") 108, which is a computational resource for executing and otherwise processing instructions, and for performing additional operations (e.g., communicating information) in response thereto; (b) an amplifier ("AMP") 110 for receiving electrical signals from the DSP 108, and for outputting amplified versions of those signals ("output voltage signals") to the speaker 104 under control of the DSP 108; (c) a computer-readable medium 112 (e.g., a nonvolatile memory device) for storing information; and (d) various other electronic circuitry (not shown in FIG. 1) for performing other operations of the control device 102.

The DSP 108 executes various processes and performs operations (e.g., processing and communicating information) in response thereto. For example, the DSP 108 receives: (a) input voltage signals (e.g., from an audio decoder of the portable handheld electronics device); (b) instructions of computer-readable software programs that are stored on the computer-readable medium 112; and (c) optionally, the output voltage signals from the amplifier 110, so that the DSP 108 controls the output voltage signals in a feedback loop. Accordingly, the DSP 108 executes such programs and performs its operations in response to such input voltage signals, such instructions, and optionally in response to the output voltage signals. For executing such programs, the DSP 108 processes data, which are stored in memory of the DSP 108 and/or in the computer-readable medium 112.

Figure 2:
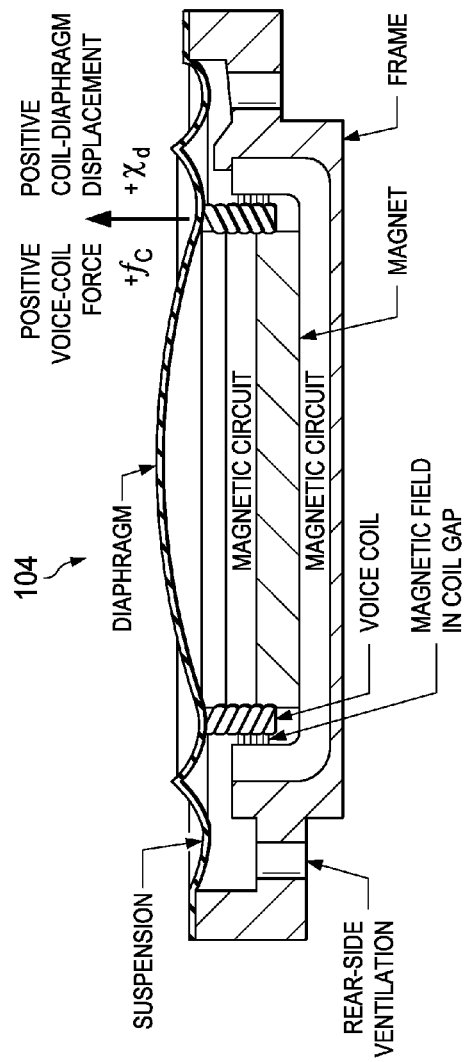
FIG. 2 is a side sectional view, in elevation, of a speaker of FIG. 1.

FIG. 2 is a side sectional view, in elevation, of the speaker 104. As shown in FIG. 2, a voice coil is attached to a diaphragm, which is mounted on a fixed frame via a suspension. A permanent magnet generates a concentrated magnetic field in a region of the voice coil's gap. Such magnetic field is conducted to such region via a magnetic circuit. Rear-side ventilation occurs through holes in a rear enclosure of the fixed frame.

According to laws of electrodynamics, in response to the concentrated magnetic field, an electromotive force ("EMF") $f_c$ is generated by an electrical current passing through the voice coil. Such voice-coil force $f_c$ varies in response to an amount of such electrical current, which varies in response to the output voltage signals from the amplifier 110. Such voice-coil force $f_c$ causes a displacement $x_d$ (which is excursion) of the diaphragm, thereby generating a sound wave output of audio signals.

Figure 3:
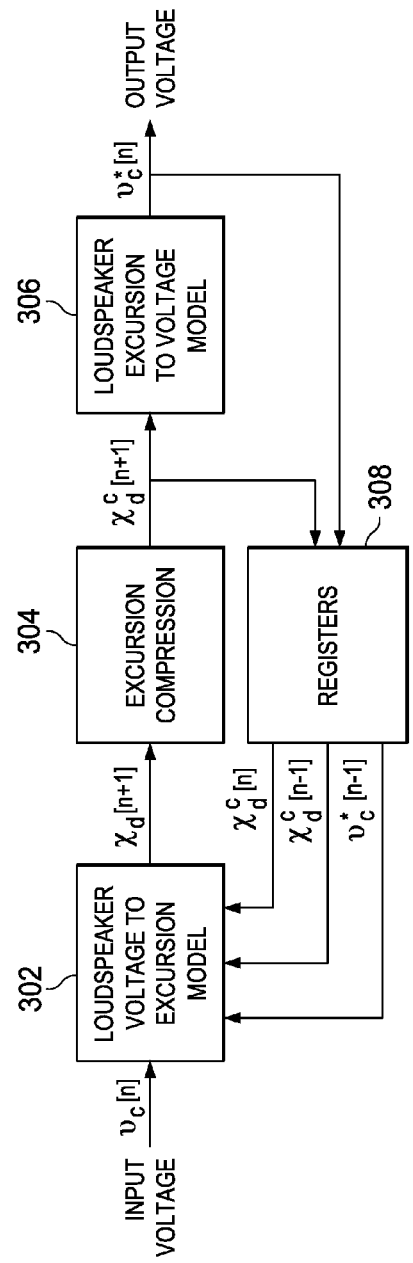
FIG. 3 is a data flow diagram of operations for protecting the speaker of FIG. 1.

FIG. 3 is a data flow diagram of the control device 102 operations for protecting the speaker 104. As shown in FIG. 3, in response to a current sampling interval n's input voltage $v_c[n]$ signal (e.g., from an audio decoder of the portable handheld electronics device), the current sampling interval n's targeted peak excursion $x_d^c[n]$ of the speaker 104, a previous sampling interval n−1's targeted peak excursion $x_d^c[n-1]$ of the speaker 104, the previous sampling interval n−1's driving output voltage $v^*_c[n-1]$ signal, and a nonlinear voltage-to-excursion model 302, the control device 102 predicts a next sampling interval n+1's estimated peak excursion $x_d[n+1]$ of the speaker 104 that would be caused by such $v_c[n]$, $x_d^c[n]$, $x_d^c[n-1]$, $v^*_c[n-1]$ and $\dot{x}_d^c[n-1]$ ("voltage-to-excursion operation").

In response to $x_d[n+1]$, the control device 102 selectively performs an excursion compression 304 operation to determine and specify the next sampling interval n+1's targeted peak excursion $x_d^c[n+1]$ of the speaker 104, so that: (a) in response to $x_d[n+1]$ exceeding a programmable displacement threshold's safe peak excursion limit, the control device 102 specifies $x_d^c[n+1]$ by compressing $x_d[n+1]$ at a programmable compression ratio (e.g., instead of hard clipping the excursion at the safe peak excursion limit); and (b) otherwise, the control device 102 specifies $x_d^c[n+1]=x_d[n+1]$.

In response to a nonlinear excursion-to-voltage model 306 (which is an inverse of the nonlinear voltage-to-excursion model 302), the control device 102 translates $x_d^c[n+1]$ into the current sampling interval n's driving output voltage $v^*_c[n]$ signal ("excursion-to-voltage operation"), which the control device 102 outputs from the amplifier 110 (under control of the DSP 108) to substantially cause $x_d^c[n+1]$ at the speaker 104. Accordingly, the speaker 104: (a) receives the $v^*_c[n]$ signal from the amplifier 110; and (b) outputs audio signals in response thereto. In that real-time manner, the control device 102: (a) directly protects the speaker 104; (b) makes fewer modifications to the driving output voltage $v^*_c[n]$ signal (in comparison to the input voltage $v_c[n]$ signal); and (c) causes less perceived distortion of sound and/or perceived loudness of the speaker 104.

As shown in FIG. 3, the control device 102 includes registers 308 for storing values of: (a) $x_c^c[n+1]$ from the excursion compression 304 operation; and (b) $v^*_c[n]$ from the excursion-to-voltage operation. For example: (a) if the current sampling interval n=i+1, then the stored value of $x_d^c[i+1]$ is $x_d^c[n]$, the stored value of $x_d^c[i]$ is $x_d^c[n-1]$, and the stored value of $v^*_c[i]$ is $v^*_c[n-1]$; and (b) if the current sampling interval n=i+2, then the stored value of $x_d^c[i+2]$ is $x_d^c[n]$, the stored value of $x_d^c[i+1]$ is $x_d^c[n-1]$, and the stored value of $v^*_c[i+1]$ is $v^*_c[n-1]$.

Figure 4:
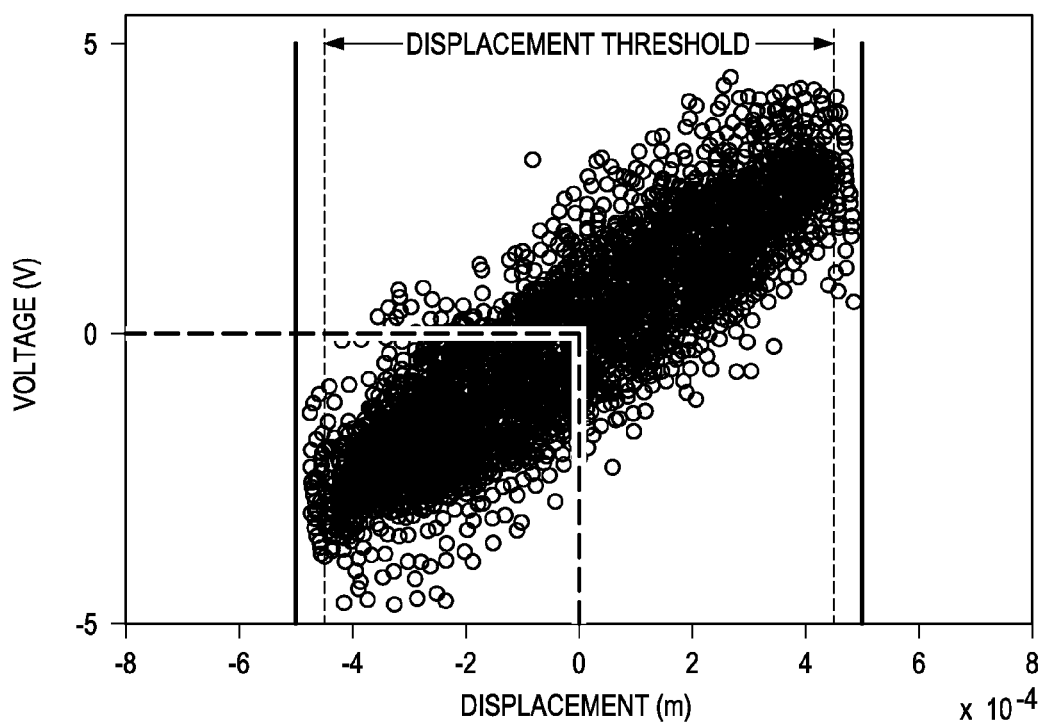
FIG. 4 is a graph of peak excursion (x-axis) in response to voltage signals (y-axis), according to a first simulation of operation with a control device of FIG. 1 enabled.

FIG. 4 is a graph of the speaker 104 peak excursion (x-axis) in response to voltage signals (y-axis) from the amplifier 110, according to a first simulation of operation with the control device 102 enabled. As shown in FIG. 4, with the control device 102 enabled, the scatter plot is compressed horizontally (x-axis) in response to an example of the programmable displacement threshold's safe peak excursion limit=±0.45 mm.

Figure 5:
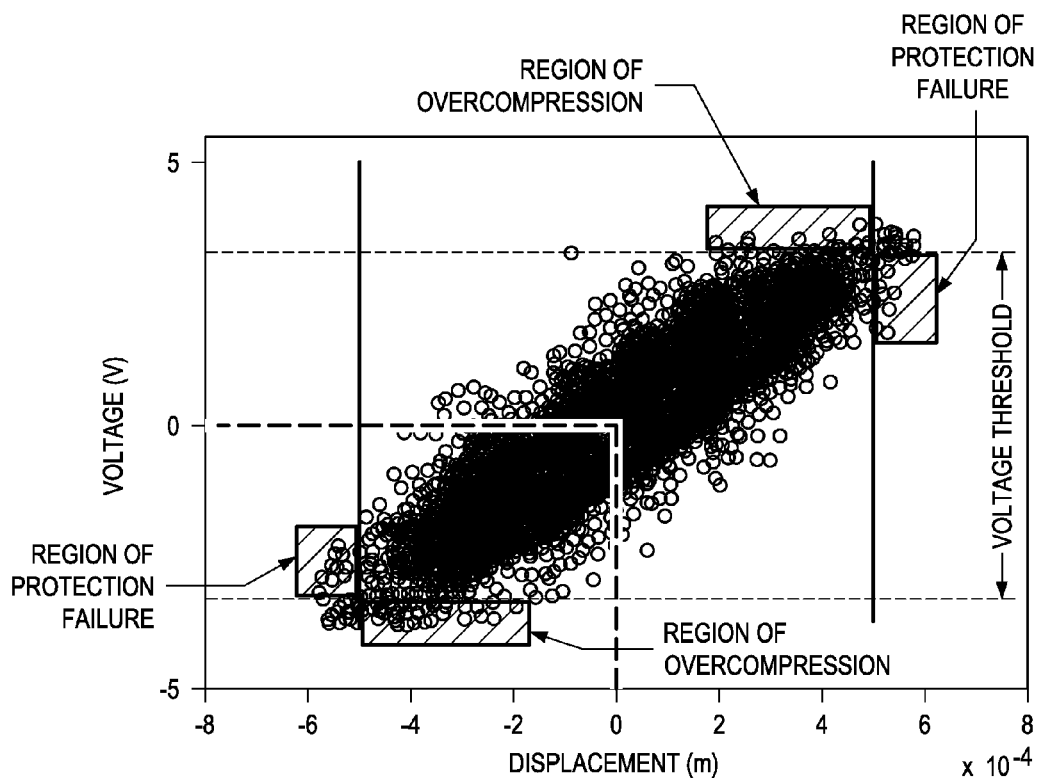
FIG. 5 is a graph of peak excursion (x-axis) in response to voltage signals (y-axis), according to a second simulation of operation with the control device of FIG. 1 disabled.

FIG. 5 is a graph of the speaker 104 peak excursion (x-axis) in response to voltage signals (y-axis) from the amplifier 110, according to a second simulation of operation with the control device 102 disabled. As shown in FIG. 5, with the control device 102 disabled, even if such operation had implemented a conventional DRC technique: (a) the scatter plot would be compressed vertically (y-axis) in response to a voltage threshold's example limit of $v^*_c[n]=\pm 3$ volts; (b) regions of overcompression would exist, where the voltage signals would be unnecessarily compressed (in a manner that distorts sound and/or reduces perceived loudness of the speaker 104), despite peak excursion of the speaker 104 already being within a safe operating range (within an example of the programmable displacement threshold's safe peak excursion limit=±0.5 mm); and (c) regions of protection failure would exist, where over-excursion of the speaker 104 may still occur (beyond the example of the programmable displacement threshold's safe peak excursion limit=±0.5 mm), despite the voltage signal's amplitude being within the voltage threshold's example limit of $v^*_c[n]=\pm 3$ volts. Accordingly, in a comparison of FIG. 4 and FIG. 5, a more effective (e.g., precise and timely) is achieved with the control device 102 enabled (FIG. 4).

Referring again to FIG. 2, a continuous-time nonlinear model for electrical behavior of the speaker 104 is:

$$v_c(t) = R_{eb} i_c(t) + \phi_0 \dot{x}_d(t), \tag{1}$$

where $v_c(t)$ is a voltage input across terminals of the voice coil, $R_{eb}$ is a blocked electrical resistance, $i_c(t)$ is a voice coil current, $\phi_0$ is a transduction coefficient at an equilibrium state $x_d(t)=0$, $x_d(t)$ is a diaphragm excursion, and $\dot{x}_d(t)$ is a diaphragm velocity.

Mechanical dynamics of the speaker 104 can be modeled as a single-degree-of-freedom mechanical oscillator by:

$$m_d \ddot{x}_d(t) + c_d \dot{x}_d(t) + k_d x_d(t) = f_c(t), \tag{2}$$

where $m_d$ is a mass of the diaphragm, $c_d$ is a mechanical resistance due to diaphragm suspension, $k_d$ is a mechanical stiffness due to diaphragm suspension, $\ddot{x}_d(t)$ is a diaphragm acceleration, and $f_c(t)$ is an EMF exerted on the voice coil. At the equilibrium state where $x_d(t)=0$, $$f_c(t) = \phi_0 i_c(t). \tag{3}$$

By combining the electrical and mechanical loudspeaker models of equations (1), (2) and (3), an s-domain transfer function of excursion versus voltage input at the equilibrium state is $$\frac{x_d(s)}{v_c(s)} = \frac{(\phi_0/R_{eb})}{m_d s^2 + (c_d + \phi_0^2/R_{eb})s + k_d}. \tag{4}$$

A z-domain transfer function can be obtained by applying either a bilinear transformation or an impulse invariance method to equation (4).

However, in order to yield a more precise model, several additional nonlinear factors are considered. For example, mechanical nonlinearities are caused by variations of the transduction coefficient $\phi$ and suspension stiffness $k_d$, as parabola-like functions in relation to the excursion $x_d(t)$. Accordingly, a more precise expression for $f_c(t)$ is $$f_c(t) = \phi(x_d(t))i_c(t) - k_1(x_d(t))x_d(t), \quad (5)$$

where $k_1(x_d(t))$ is a variation of the suspension stiffness $k_d$ as a function of excursion, which is expressed as $$k_1(x_d(t)) = k_d(x_d(t)) - k_d(0), \quad (6)$$

Similarly, electrical nonlinearities are caused by variations of $R_{eb}$ in relation to temperature T, as expressed by $$R_{eb}(T) = R_{eb}(T_0)(1 + \alpha(T - T_0)), \quad (7)$$

where $\alpha$ is a temperature coefficient ($\alpha_{copper} = 0.004 K^{-1}$), and $T_0$ is an ambient temperature. Accordingly, equation (1) is rewritten as $$v_c(t) = R_{eb}(t)i_c(t) + \phi(x_d(t))\dot{x}_d(t), \quad (8)$$

Equations (2), (5) and (8) complete the continuous-time nonlinear model of the speaker 104.

For digital processing, the control device 102 implements a discrete-time nonlinear model of the speaker 104, which is discussed hereinbelow. From equation (2), a transfer function of mechanical receptance $x_m(s)$ is $$X_m(s) = \frac{x_d(s)}{f_c(s)} = \frac{1}{m_d s^2 + c_d s + k_d}. \quad (9)$$

Using the impulse-invariance method, a z-domain transfer function for $X_m(s)$ is $$H_{X_m}(z) = \frac{x_d(z)}{f_c(z)} = \frac{b_1 z^{-1}}{1 + a_1 z^{-1} + a_2 z^{-2}}, \quad (10)$$

where $a_1$, $a_2$, $b_1$ are functions of $m_d$, $c_d$, $k_d$ and a sampling frequency $F_s$. Accordingly, a discrete-time diaphragm excursion $x_d[n]$ is expressed as $$x_d[n] = b_1 f_c[n-1] - a_1 x_d[n-1] - a_2 x_d[n-2] \quad (11)$$

where a discrete-time EMF $f_c[n]$ exerted on the voice coil is determined from equations (8) and (5) as:

$$f_c[n] = \phi(x_d[n])\left(\frac{1}{R_{eb}[n]}\{v_c[n] - \phi(x_d[n])\dot{x}_d[n]\}\right) - k_1(x_d[n])x_d[n] \quad (12)$$

A diaphragm velocity $\dot{x}_d[n]$ is computed by differentiating $x_d[n]$ according to a first order IIR filter, which is expressed as $$\dot{x}_d[n] = 2F_s(x_d[n] - x_d[n-1]) - a_d \dot{x}_d[n-1], \quad (13)$$

where $F_s$ is a sampling frequency, and $0 < a_d \le 1$ is a differentiator coefficient for ensuring stability.

Equations (11), (12) and (13) complete the discrete-time nonlinear model of the speaker 104. The control device 102 implements the discrete-time nonlinear model of the speaker 104 by performing the voltage-to-excursion operation in accordance with equations (11), (12) and (13). In such implementation by the control device 102, the diaphragm excursion $x_d[n+1]$ is a function of: $v_c[n]$; $x_d^c[n]$; $x_d^c[n-1]$; $v_c^*[n-1]$; and the current sampling interval n's diaphragm velocity $\dot{x}_d^c[n]$. The control device 102 computes $\dot{x}_d^c[n]$ in accordance with equation (13), so that $\dot{x}_d^c[n]$ is a function of: $x_d^c[n]$; $x_d^c[n-1]$; and $\dot{x}_d^c[n-1]$.

In view of point-wise nonlinearity of the transduction coefficient $\phi$ and suspension stiffness $k_d$ in relation to the excursion $x_d(t)$, the voltage-to-excursion relationship is inverted for performance of the excursion-to-voltage operation by the control device 102. For example, according to equation (11), $$f_c[n] = \frac{1}{b_1}(x_d[n+1] + a_1 x_d[n] + a_2 x_d[n-1]) \quad (14)$$

Moreover, according to equations (8) and (5), $$v_c[n] = R_{eb}[n]\left\{\frac{1}{\phi(x_d[n])}(f_c[n] + k_1(x_d[n])x_d[n])\right\} + \phi(x_d[n])\dot{x}_d[n] \quad (15)$$

Figure 6:
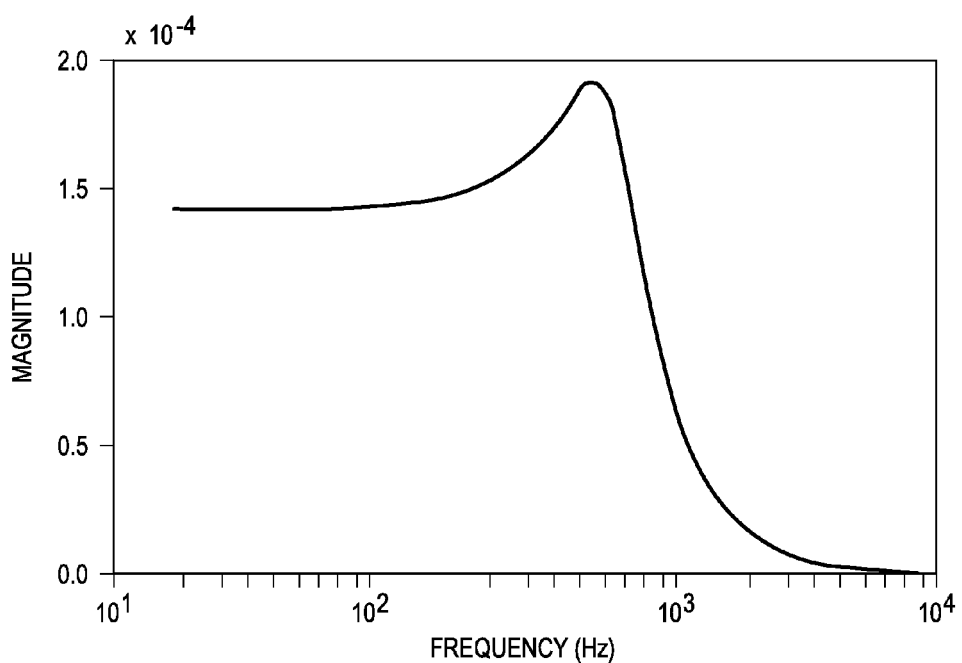
FIG. 6 is a graph of an example frequency response of a transfer function.

FIG. 6 is a graph of an example frequency response of the transfer function in equation (4). FIG. 6 shows a linearized micro-loudspeaker excursion-to-voltage frequency response with $m_d$=0.014 g, $c_d$=0.039 Ns/m, $k_d$=284 N/m, $\phi_0$=0.3 N/A and $R_{eb}$=7.5Ω. The lowpass characteristic suggests that large excursions are caused by low frequency components of the input voltage $v_c[n]$ signal.

Figure 7:
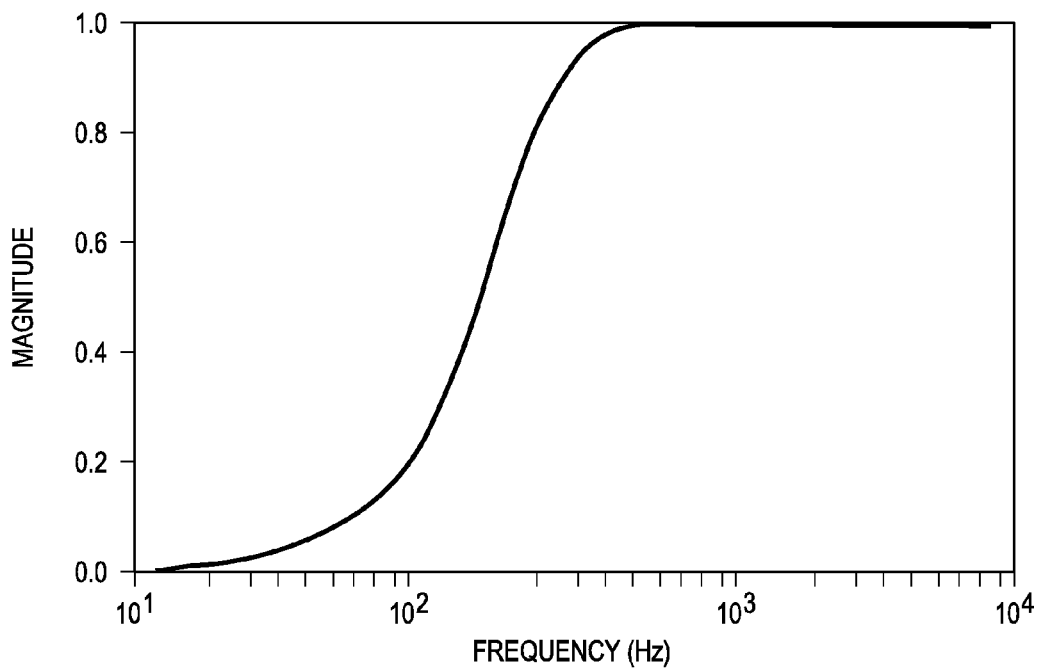
FIG. 7 is a graph of an example frequency response of a highpass filter.

FIG. 7 is a graph of an example frequency response of a highpass filter. FIG. 7 shows the frequency response of a corresponding digital Butterworth highpass filter with $f_{cut-off}$=200 Hz and $F_s$=16 kHz. Although the graph of FIG. 6 indicates that a highpass filtering of the input signal might protect the speaker 104 against excessive excursion (by reducing gain in low frequency signal components), the graph of FIG. 7 indicates that such highpass filtering could impair low frequency content more than necessary when protecting against only a any over-excursions.

Figure 8:
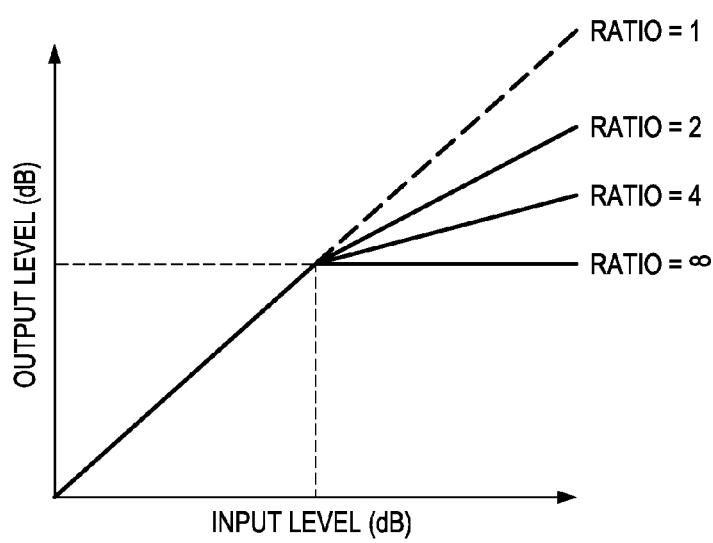
FIG. 8 is a graph of a gain mapping characteristic of an excursion compression operation of the information handling system of FIG. 1.

FIG. 8 is a graph of a gain mapping characteristic of the excursion compression 304 operation. FIG. 8 shows an input-output relationship for the excursion compression 304 operation, which the control device 102 performs at a programmable compression ratio (e.g., instead of hard clipping the excursion at the safe peak excursion limit) to directly protect against over-excursion. For example, by suitably programming the compression ratio (e.g., if the compression ratio is less than 5), the control device 102 is adaptable to perform the excursion compression 304 operation with relatively smooth compression (e.g., soft knees) and less perceived distortion. FIG. 8 shows the compression ratio programmed to implement piecewise linear curves for the excursion compression 304 operation in the illustrative embodiments, but the compression ratio is programmable to implement smoother nonlinear curves for the excursion compression 304 operation in alternative embodiments. By comparison, if the compression ratio=∞, then the excursion compression 304 operation equates to hard clipping.

Figure 9:
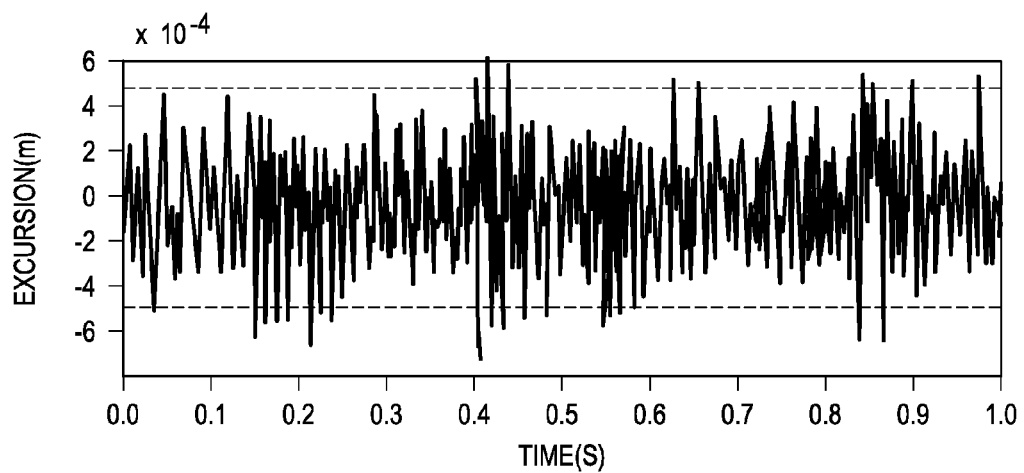
FIG. 9 is a graph of excursion when playing an example clip of music without filtering.
Figure 10:
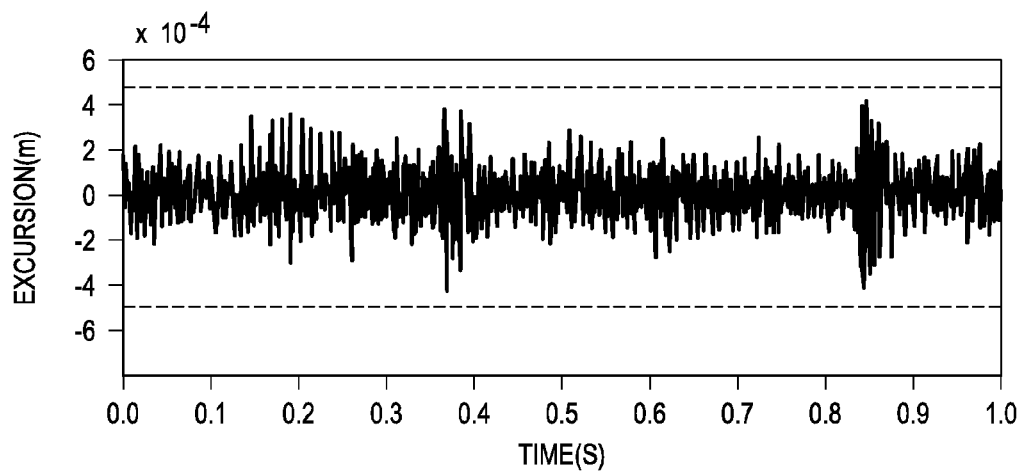
FIG. 10 is a graph of excursion when playing the example clip of music with conventional highpass filtering protection.
Figure 11:
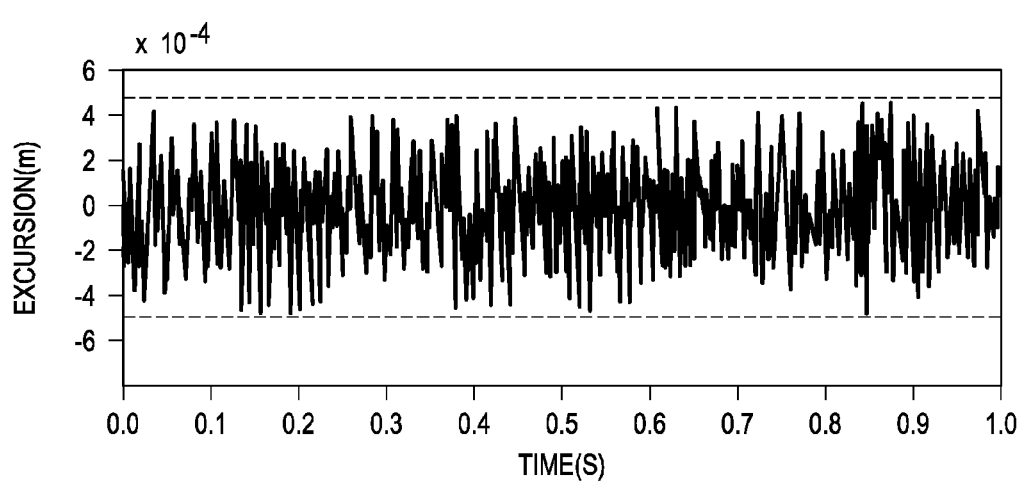
FIG. 11 is a graph of excursion when playing the example clip of music with the control device of FIG. 1 enabled for excursion protection according to the illustrative embodiments.

FIG. 9 is a graph of excursion when playing an example clip of music without filtering. FIG. 10 is a graph of excursion when playing the example clip of music with conventional highpass filtering protection, in a case where the highpass filter's frequency response is the same as shown in FIG. 7. FIG. 11 is a graph of excursion when playing the example clip of music with the control device 102 enabled for excursion protection according to the illustrative embodiments, in a case where the gain mapping curve has a threshold of $0.9x_{max}$ and a compression ratio of 2. In the example of FIGS. 9-11, the sampling frequency is $F_s=16$ kHz, and the programmable displacement threshold's safe peak excursion limit is $x_{max}=\pm0.5$ mm.

As shown in FIG. 9, without protection, the excursions occasionally exceed an example safe peak excursion limit=±0.5 mm. As shown in the example of FIG. 10, conventional highpass filtering protection causes distortion relative to the graph of FIG. 9 (e.g., such filtering reduces excursion, but suppresses a bass range of sounds, and degrades the input voltage signal-to-noise ratio to −0.93 dB). In a comparison of FIG. 10 and FIG. 11, relatively little distortion is caused by the control device 102 enabled for excursion protection according to the illustrative embodiments (e.g., the input voltage signal-to-noise ratio is enhanced to 18.97 dB).

As shown in FIG. 11, with the control device 102 enabled for excursion protection according to the illustrative embodiments, the control device 102 modifies the driving output voltage $v^*_c[n]$ signal (in comparison to the input voltage $v_c[n]$ signal), but only if the control device 102 (in accordance with the discrete-time nonlinear model of the speaker 104) predicts that the unmodified input voltage $v_c[n]$ signal would otherwise cause over-excursion of the speaker 104. Accordingly, in a comparison of FIG. 10 and FIG. 11, the control device 102 makes fewer modifications to the driving output voltage $v^*_c[n]$ signal (in comparison to the input voltage $v_c[n]$ signal), distortions are relatively few in comparison to the example of FIG. 10, and such modifications have a smaller average magnitude.

In the illustrative embodiments, a computer program product is an article of manufacture that has: (a) a computer-readable medium; and (b) a computer-readable program that is stored on such medium. Such program is processable by an instruction execution apparatus (e.g., system or device) for causing the apparatus to perform various operations discussed hereinabove (e.g., discussed in connection with a block diagram). For example, in response to processing (e.g., executing) such program's instructions, the apparatus (e.g., programmable information handling system) performs various operations discussed hereinabove. Accordingly, such operations are computer-implemented.

Such program (e.g., software, firmware, and/or microcode) is written in one or more programming languages, such as: the DSP 108 native assembly language; a procedural programming language (e.g., C); an object-oriented programming language (e.g., Java, Smalltalk, and C++); and/or any suitable combination thereof. In a first example, the computer-readable medium is a computer-readable storage medium. In a second example, the computer-readable medium is a computer-readable signal medium.

A computer-readable storage medium includes any system, device and/or other non-transitory tangible apparatus (e.g., electronic, magnetic, optical, electromagnetic, infrared, semiconductor, and/or any suitable combination thereof) that is suitable for storing a program, so that such program is processable by an instruction execution apparatus for causing the apparatus to perform various operations discussed hereinabove. Examples of a computer-readable storage medium include, but are not limited to: an electrical connection having one or more wires; a portable computer diskette; a hard disk; a random access memory ("RAM"); a read-only memory ("ROM"); an erasable programmable read-only memory ("EPROM" or flash memory); an optical fiber; a portable compact disc read-only memory ("CD-ROM"); an optical storage device; a magnetic storage device; and/or any suitable combination thereof.

A computer-readable signal medium includes any computer-readable medium (other than a computer-readable storage medium) that is suitable for communicating (e.g., propagating or transmitting) a program, so that such program is processable by an instruction execution apparatus for causing the apparatus to perform various operations discussed hereinabove. In one example, a computer-readable signal medium includes a data signal having computer-readable program code embodied therein (e.g., in baseband or as part of a carrier wave), which is communicated (e.g., electronically, electromagnetically, and/or optically) via wireline, wireless, optical fiber cable, and/or any suitable combination thereof.

Although illustrative embodiments have been shown and described by way of example, a wide range of alternative embodiments is possible within the scope of the foregoing disclosure.

What is claimed is:

1. A method of protecting a speaker, the method comprising:
   receiving an input signal;
   predicting an excursion of the speaker that would be caused by the input signal;
   in response to the predicted excursion, determining a targeted excursion of the speaker at least in part by compressing the predicted excursion in response to the predicted excursion exceeding a threshold;
   translating the targeted excursion into an output signal in response to an excursion-to-voltage model of operation of the speaker; and
   outputting the output signal to the speaker.

2. The method of claim 1, wherein predicting the excursion includes: predicting the excursion in response to a nonlinear voltage-to-excursion model of operation of the speaker.

3. The method of claim 2, wherein predicting the excursion includes: predicting the excursion in response to at least one of: a previous targeted excursion of the speaker; and a previous output signal that was output to the speaker.

4. The method of claim 3, and comprising:
   storing at least one of: the previous targeted excursion of the speaker; and the previous output signal that was output to the speaker.

5. The method of claim 1, wherein determining the targeted excursion includes: in response to the predicted excursion being less than the threshold, determining the targeted excursion as being equal to the predicted excursion.

6. The method of claim 1, wherein compressing the predicted excursion includes: compressing the predicted excursion at a compression ratio.

7. The method of claim 6, wherein the compression ratio is programmable.

8. The method of claim 7, wherein the compression ratio is programmed to implement at least one of: a piecewise linear curve; and a nonlinear curve.

9. The method of claim 1, wherein the excursion-to-voltage model of operation of the speaker is a nonlinear excursion-to-voltage model of operation of the speaker.

10. A system for protecting a speaker, the system comprising:
    at least one device for: receiving an input signal; predicting an excursion of the speaker that would be caused by the input signal; in response to the predicted excursion, determining a targeted excursion of the speaker at least in part by compressing the predicted excursion in response to the predicted excursion exceeding a threshold; translating the targeted excursion into an output signal in response to an excursion-to-voltage model of operation of the speaker; and outputting the output signal to the speaker.

11. The system of claim 10, wherein predicting the excursion includes: predicting the excursion in response to a nonlinear voltage-to-excursion model of operation of the speaker.

12. The system of claim 11, wherein predicting the excursion includes: predicting the excursion in response to at least one of: a previous targeted excursion of the speaker; and a previous output signal that was output to the speaker.

13. The system of claim 12, wherein the at least one device is for storing at least one of: the previous targeted excursion of the speaker; and the previous output signal that was output to the speaker.

14. The system of claim 10, wherein determining the targeted excursion includes: in response to the predicted excursion being less than the threshold, determining the targeted excursion as being equal to the predicted excursion.

15. The system of claim 10, wherein compressing the predicted excursion includes: compressing the predicted excursion at a compression ratio.

16. The system of claim 15, wherein the compression ratio is programmable.

17. The system of claim 16, wherein the compression ratio is programmed to implement at least one of: a piecewise linear curve; and a nonlinear curve.

18. The system of claim 10, wherein the excursion-to-voltage model of operation of the speaker is a nonlinear excursion-to-voltage model of operation of the speaker.

19. A computer program product for protecting a speaker, the computer program product comprising:
   a tangible computer-readable storage medium; and
   a computer-readable program stored on the tangible computer-readable storage medium, wherein the computer-readable program is processable by an information handling system for causing the information handling system to perform operations including: receiving an input signal; predicting an excursion of the speaker that would be caused by the input signal; in response to the predicted excursion, determining a targeted excursion of the speaker at least in part by compressing the predicted excursion in response to the predicted excursion exceeding a threshold; translating the targeted excursion into an output signal in response to an excursion-to-voltage model of operation of the speaker; and outputting the output signal to the speaker.

20. The computer program product of claim 19, wherein predicting the excursion includes: predicting the excursion in response to a nonlinear voltage-to-excursion model of operation of the speaker.

21. The computer program product of claim 20, wherein predicting the excursion includes: predicting the excursion in response to at least one of: a previous targeted excursion of the speaker; and a previous output signal that was output to the speaker.

22. The computer program product of claim 21, wherein the operations include:
   storing at least one of: the previous targeted excursion of the speaker; and the previous output signal that was output to the speaker.

23. The computer program product of claim 19, wherein determining the targeted excursion includes: in response to the predicted excursion being less than the threshold, determining the targeted excursion as being equal to the predicted excursion.

24. The computer program product of claim 19, wherein compressing the predicted excursion includes: compressing the predicted excursion at a compression ratio.

25. The computer program product of claim 24, wherein the compression ratio is programmable.

26. The computer program product of claim 25, wherein the compression ratio is programmed to implement at least one of: a piecewise linear curve; and a nonlinear curve.

27. The computer program product of claim 19, wherein the excursion-to-voltage model of operation of the speaker is a nonlinear excursion-to-voltage model of operation of the speaker.

* * * * *